(12) United States Patent
Maheshwari et al.

(10) Patent No.: US 9,224,454 B2
(45) Date of Patent: Dec. 29, 2015

(54) MULTI-CHANNEL PHYSICAL INTERFACES AND METHODS FOR STATIC RANDOM ACCESS MEMORY DEVICES

(71) Applicant: CYPRESS SEMICONDUCTOR CORPORATION, San Jose, CA (US)

(72) Inventors: Dinesh Maheshwari, Fremont, CA (US); Derwin W. Mattos, San Mateo, CA (US); Avi Avanindra, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/229,765

(22) Filed: Mar. 28, 2014

(65) Prior Publication Data

US 2015/0117092 A1   Apr. 30, 2015

Related U.S. Application Data

(60) Provisional application No. 61/895,852, filed on Oct. 25, 2013, provisional application No. 61/912,519, filed on Dec. 5, 2013, provisional application No. 61/918,885, filed on Dec. 20, 2013.

(51) Int. Cl.
  *G11C 11/41*      (2006.01)
  *G11C 11/419*     (2006.01)
  *G11C 7/10*       (2006.01)
  *G11C 5/02*       (2006.01)

(52) U.S. Cl.
  CPC ............ *G11C 11/419* (2013.01); *G11C 7/1075* (2013.01); *G11C 5/025* (2013.01)

(58) Field of Classification Search
  CPC ...... G11C 5/025; G11C 7/1075; G11C 11/419
  USPC ............... 365/154, 189.04; 710/305; 714/43
  See application file for complete search history.

(56) References Cited

U.S. PATENT DOCUMENTS

| 5,247,637 | A  | * | 9/1993  | Leedom et al. ............... 711/149 |
| 5,870,350 | A  |   | 2/1999  | Bertin et al. |
| 6,006,318 | A  |   | 12/1999 | Hansen et al. |
| 6,330,185 | B1 |   | 12/2001 | Wong et al. |
| 6,988,154 | B2 | * | 1/2006  | Latta ............................ 710/240 |
| 7,080,283 | B1 | * | 7/2006  | Songer et al. .................. 714/30 |
| 7,246,215 | B2 |   | 7/2007  | Lu et al. |
| 7,830,735 | B2 |   | 11/2010 | Ware et al. |
| 7,970,990 | B2 |   | 6/2011  | Forrest et al. |
| 8,266,372 | B2 |   | 9/2012  | Gillingham et al. |
| 2006/0221945 | A1 | * | 10/2006 | Chin et al. .................... 370/381 |
| 2012/0007873 | A1 |   | 1/2012  | Margulis |
| 2012/0030396 | A1 |   | 2/2012  | Zhu et al. |
| 2013/0058145 | A1 | * | 3/2013  | Yu et al. ..................... 365/49.17 |

OTHER PUBLICATIONS

Raghavan, G., Five Emerging DRAM Interfaces You Should Know for Your Next Design, Cadence Design Systems, 2013.

* cited by examiner

*Primary Examiner* — Vanthu Nguyen

(57) ABSTRACT

An integrated circuit (IC) device can include a static random access memory (SRAM) section comprising a plurality of memory banks; and an interface comprising physical connections for more than eight memory channels, the connections for each memory channel including an address section including connections for SRAM control inputs and a complete address to access the memory banks, and a data section including data inputs and outputs (data IOs) to transfer data for one memory bank.

19 Claims, 15 Drawing Sheets

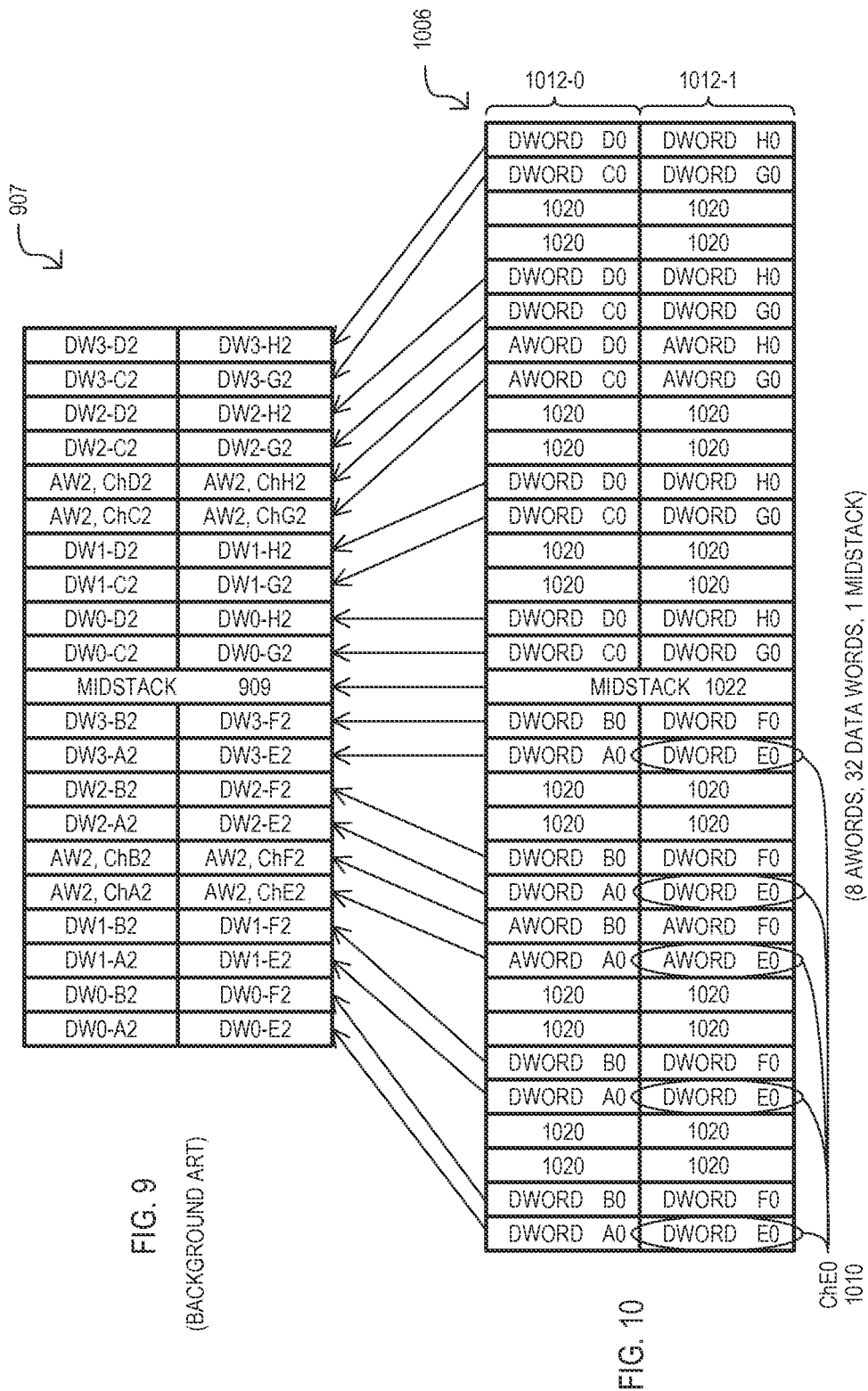

FIG. 11 — 1106 (16 AWORDS, 64 DWORDS, 2 MIDSTACKS), ChE0 1110

| 1112-0 | 1112-1 |
|---|---|
| DWORD D1 | DWORD H1 |
| DWORD C1 | DWORD G1 |
| DWORD D1 | DWORD H1 |
| DWORD C1 | DWORD G1 |
| AWORD D1 | AWORD H1 |
| AWORD C1 | AWORD G1 |
| DWORD D1 | DWORD H1 |
| DWORD C1 | DWORD G1 |
| DWORD D1 | DWORD H1 |
| DWORD C1 | DWORD G1 |
| MIDSTACK | 1122-1 |
| DWORD B1 | DWORD F1 |
| DWORD A1 | DWORD E1 |
| DWORD B1 | DWORD F1 |
| DWORD A1 | DWORD E1 |
| AWORD B1 | AWORD F1 |
| AWORD A1 | AWORD E1 |
| DWORD B1 | DWORD F1 |
| DWORD A1 | DWORD E1 |
| DWORD B1 | DWORD F1 |
| DWORD A1 | DWORD E1 |
| DWORD D0 | DWORD H0 |
| DWORD C0 | DWORD G0 |
| DWORD D0 | DWORD H0 |
| DWORD C0 | DWORD G0 |
| AWORD D0 | AWORD H0 |
| AWORD C0 | AWORD G0 |
| DWORD D0 | DWORD H0 |
| DWORD C0 | DWORD G0 |
| DWORD D0 | DWORD H0 |
| DWORD C0 | DWORD G0 |
| MIDSTACK | 1122-0 |
| DWORD B0 | DWORD F0 |
| DWORD A0 | DWORD E0 |
| DWORD B0 | DWORD F0 |
| DWORD A0 | DWORD E0 |
| AWORD B0 | AWORD F0 |
| AWORD A0 | AWORD E0 |
| DWORD B0 | DWORD F0 |
| DWORD A0 | DWORD E0 |
| DWORD B0 | DWORD F0 |
| DWORD A0 | DWORD E0 |

FIG. 12 — 1206 (16 AWORDS, 64 DWORDS, 1 MIDSTACK), ChE0 1210

| 1112-0 | 1112-1 |
|---|---|
| DWORD D1 | DWORD H1 |
| DWORD C1 | DWORD G1 |
| DWORD D1 | DWORD H1 |
| DWORD C1 | DWORD G1 |
| AWORD D1 | AWORD H1 |
| AWORD C1 | AWORD G1 |
| DWORD D1 | DWORD H1 |
| DWORD C1 | DWORD G1 |
| DWORD D1 | DWORD H1 |
| DWORD C1 | DWORD G1 |
| DWORD B1 | DWORD F1 |
| DWORD A1 | DWORD E1 |
| DWORD B1 | DWORD F1 |
| DWORD A1 | DWORD E1 |
| AWORD B1 | AWORD F1 |
| AWORD A1 | AWORD E1 |
| DWORD B1 | DWORD F1 |
| DWORD A1 | DWORD E1 |
| DWORD B1 | DWORD F1 |
| DWORD A1 | DWORD E1 |
| MIDSTACK | 1222 |
| DWORD D0 | DWORD H0 |
| DWORD C0 | DWORD G0 |
| DWORD D0 | DWORD H0 |
| DWORD C0 | DWORD G0 |
| AWORD D0 | AWORD H0 |
| AWORD C0 | AWORD G0 |
| DWORD D0 | DWORD H0 |
| DWORD C0 | DWORD G0 |
| DWORD D0 | DWORD H0 |
| DWORD C0 | DWORD G0 |
| DWORD B0 | DWORD F0 |
| DWORD A0 | DWORD E0 |
| DWORD B0 | DWORD F0 |
| DWORD A0 | DWORD E0 |
| AWORD B0 | AWORD F0 |
| AWORD A0 | AWORD E0 |
| DWORD B0 | DWORD F0 |
| DWORD A0 | DWORD E0 |
| DWORD B0 | DWORD F0 |
| DWORD A0 | DWORD E0 |

| 1312-0 | 1312-1 |
|---|---|
| AWORD D3 | AWORD H3 |
| DWORD D3 | DWORD H3 |
| AWORD C3 | AWORD G3 |
| DWORD C3 | DWORD G3 |
| AWORD D2 | AWORD H2 |
| DWORD D2 | DWORD H2 |
| AWORD C2 | AWORD G2 |
| DWORD C2 | DWORD G2 |
| AWORD D1 | AWORD H1 |
| DWORD D1 | DWORD H1 |
| AWORD C1 | AWORD G1 |
| DWORD C1 | DWORD G1 |
| AWORD D0 | AWORD H0 |
| DWORD D0 | DWORD H0 |
| AWORD C0 | AWORD G0 |
| DWORD C0 | DWORD G0 |
| MIDSTACK 1322 | |
| AWORD B3 | AWORD F3 |
| DWORD B3 | DWORD F3 |
| AWORD A3 | AWORD E3 |
| DWORD A3 | DWORD E3 |
| AWORD B2 | AWORD F2 |
| DWORD B2 | DWORD F2 |
| AWORD A2 | AWORD E2 |
| DWORD A2 | DWORD E2 |
| AWORD B1 | AWORD F1 |
| DWORD B1 | DWORD F1 |
| AWORD A1 | AWORD E1 |
| DWORD A1 | DWORD E1 |
| AWORD B0 | AWORD F0 |
| DWORD B0 | DWORD F0 |
| AWORD A0 | AWORD E0 |
| DWORD A0 | DWORD E0 |

(32 AWORDS, 32 DWORDS, 1 MIDSTACK)

ChE0 1310

| 1412-0 | 1412-1 |
|---|---|
| DWORD D3 | AWORD H3 |
| DWORD D2 | AWORD H2 |
| AWORD D3 | DWORD H3 |
| AWORD D2 | DWORD H2 |
| DWORD D1 | AWORD H1 |
| DWORD D0 | AWORD H0 |
| AWORD D1 | DWORD H1 |
| AWORD D0 | DWORD H0 |
| DWORD C3 | AWORD G3 |
| DWORD C2 | AWORD G2 |
| AWORD C3 | DWORD G3 |
| AWORD C2 | DWORD G2 |
| DWORD C1 | AWORD G1 |
| DWORD C0 | AWORD G0 |
| AWORD C1 | DWORD G1 |
| AWORD C0 | DWORD G0 |
| MIDSTACK 1422 | |
| DWORD B3 | DWORD F3 |
| DWORD B2 | DWORD F3 |
| AWORD B3 | AWORD F2 |
| AWORD B2 | AWORD F2 |
| DWORD B1 | DWORD F1 |
| DWORD B0 | DWORD F1 |
| AWORD B1 | AWORD F0 |
| AWORD B0 | AWORD F0 |
| DWORD A3 | DWORD E3 |
| DWORD A2 | DWORD E3 |
| AWORD A3 | AWORD E2 |
| AWORD A2 | AWORD E2 |
| DWORD A1 | DWORD E1 |
| DWORD A0 | DWORD E0 |
| AWORD A1 | AWORD E1 |
| AWORD A0 | AWORD E0 |

(32 AWORDS, 32 DWORDS, 1 MIDSTACK)

ChE0 1410

| 1512-0 | 1512-1 |
|---|---|
| AWORD D3 | AWORD H3 |
| DWORD D3 | DWORD H3 |
| DWORD C3 | DWORD G3 |
| AWORD C3 | AWORD G3 |
| AWORD D2 | AWORD H2 |
| DWORD D2 | DWORD H2 |
| DWORD C2 | DWORD G2 |
| AWORD C2 | AWORD G2 |
| AWORD D1 | AWORD H1 |
| DWORD D1 | DWORD H1 |
| DWORD C1 | DWORD G1 |
| AWORD C1 | AWORD G1 |
| AWORD D0 | AWORD H0 |
| DWORD D0 | DWORD H0 |
| DWORD C0 | DWORD G0 |
| AWORD C0 | AWORD G0 |
| MIDSTACK | 1522 |
| AWORD B3 | AWORD F3 |
| DWORD B3 | DWORD F3 |
| DWORD A3 | DWORD E3 |
| AWORD A3 | AWORD E3 |
| AWORD B2 | AWORD F2 |
| DWORD B2 | DWORD F2 |
| DWORD A2 | DWORD E2 |
| AWORD A2 | AWORD E2 |
| AWORD B1 | AWORD F1 |
| DWORD B1 | DWORD F1 |
| DWORD A1 | DWORD E1 |
| AWORD A1 | AWORD E1 |
| AWORD B0 | AWORD F0 |
| DWORD B0 | DWORD F0 |
| DWORD A0 | DWORD E0 |
| AWORD A0 | AWORD E0 |

1506; (32 AWORDS, 32 DWORDS, 1 MIDSTACK); ChE0 1510

FIG. 15

| 1612-0 | 1612-1 |
|---|---|
| AWORD C0 | AWORD G0 |
| AWORD C1 | AWORD G1 |
| AWORD C2 | AWORD G2 |
| AWORD C3 | AWORD G3 |
| AWORD D0 | AWORD H0 |
| AWORD D1 | AWORD H1 |
| DWORD C0 | DWORD G0 |
| DWORD C1 | DWORD G1 |
| DWORD C2 | DWORD G2 |
| DWORD C3 | DWORD G3 |
| AWORD D2 | AWORD H2 |
| AWORD D3 | AWORD H3 |
| DWORD D0 | DWORD H0 |
| DWORD D1 | DWORD H1 |
| DWORD D2 | DWORD H2 |
| DWORD D3 | DWORD H3 |
| MIDSTACK | 1622 |
| DWORD B3 | DWORD F3 |
| DWORD B2 | DWORD F2 |
| DWORD B1 | DWORD F1 |
| DWORD B0 | DWORD F0 |
| AWORD B3 | AWORD F3 |
| AWORD B2 | AWORD F2 |
| DWORD A3 | DWORD E3 |
| DWORD A2 | DWORD E2 |
| DWORD A1 | DWORD E1 |
| DWORD A0 | DWORD E0 |
| AWORD B1 | AWORD F1 |
| AWORD B0 | AWORD F0 |
| AWORD A3 | AWORD E3 |
| AWORD A2 | AWORD E2 |
| AWORD A1 | AWORD E1 |
| AWORD A0 | AWORD E0 |

1606; (32 AWORDS, 32 DWORDS, 1 MIDSTACK); ChE0 1610

FIG. 16

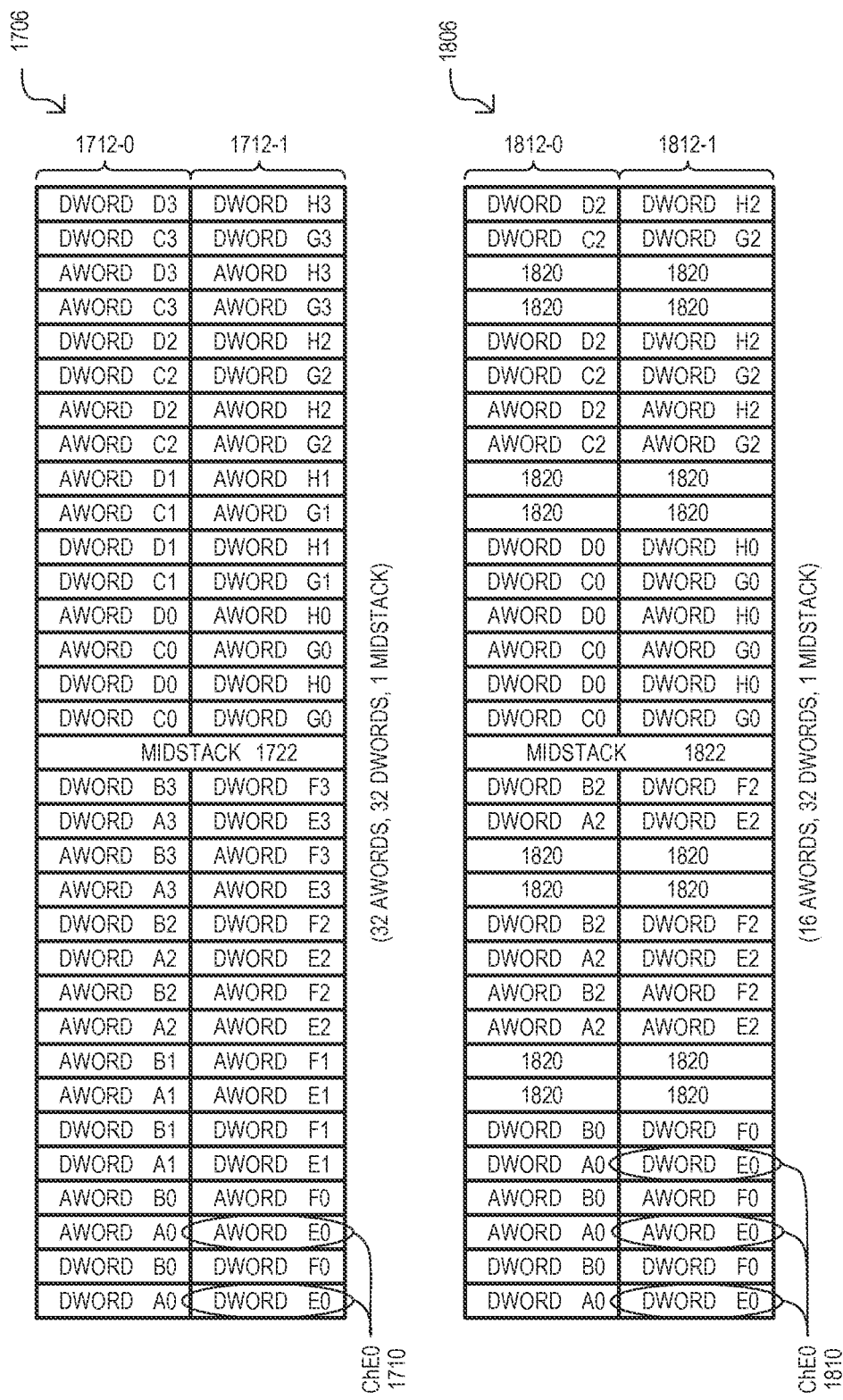

| 1912-0 | 1912-1 |
|---|---|
| 1920 | 1920 |
| DWORD D1 | DWORD H1 |
| DWORD D1 | DWORD H1 |
| 1920 | 1920 |
| AWORD D1 | AWORD H1 |
| DWORD D0 | DWORD H0 |
| DWORD D0 | DWORD H0 |
| AWORD D0 | AWORD H0 |
| AWORD C1 | AWORD G1 |
| DWORD C1 | DWORD G1 |
| DWORD C1 | DWORD G1 |
| AWORD C0 | AWORD G0 |
| 1920 | 1920 |
| DWORD C0 | DWORD G0 |
| DWORD C0 | DWORD G0 |
| 1920 | 1920 |
| MIDSTACK 1922 | |
| 1920 | 1920 |
| DWORD B1 | DWORD D1 |
| DWORD B1 | DWORD D1 |
| 1920 | 1920 |
| AWORD B1 | AWORD D1 |
| DWORD B0 | DWORD D0 |
| DWORD B0 | DWORD D0 |
| AWORD B0 | AWORD D0 |
| AWORD A1 | AWORD E1 |
| DWORD A1 | DWORD E1 |
| DWORD A1 | DWORD E1 |
| AWORD A0 | AWORD E0 |
| 1920 | 1920 |
| DWORD A0 | DWORD E0 |
| DWORD A0 | DWORD E0 |
| 1920 | 1920 |

(16 AWORDS, 32 DWORDS, 1 MIDSTACK)

ChE0 1910

| 2012-0 | 2012-1 |
|---|---|
| 2020 | 2020 |
| DWORD D0 | DWORD H0 |
| DWORD D0 | DWORD H0 |
| 2020 | 2020 |
| 2020 | 2020 |
| DWORD D0 | DWORD H0 |
| DWORD D0 | DWORD H0 |
| AWORD D0 | AWORD H0 |
| AWORD C0 | AWORD G0 |
| DWORD C0 | DWORD G0 |
| DWORD C0 | DWORD G0 |
| 2020 | 2020 |
| 2020 | 2020 |
| DWORD C0 | DWORD G0 |
| DWORD C0 | DWORD G0 |
| 2020 | 2020 |
| MIDSTACK 2022 | |
| 2020 | 2020 |
| DWORD B0 | DWORD D0 |
| DWORD B0 | DWORD D0 |
| 2020 | 2020 |
| 2020 | 2020 |
| DWORD B0 | DWORD D0 |
| DWORD B0 | DWORD D0 |
| AWORD B0 | AWORD D0 |
| AWORD A0 | AWORD E0 |
| DWORD A0 | DWORD E0 |
| DWORD A0 | DWORD E0 |
| 2020 | 2020 |
| 2020 | 2020 |
| DWORD A0 | DWORD E0 |
| DWORD A0 | DWORD E0 |
| 2020 | 2020 |

(8 AWORDS, 32 DWORDS, 1 MIDSTACK)

ChE0 2010

FIG. 22

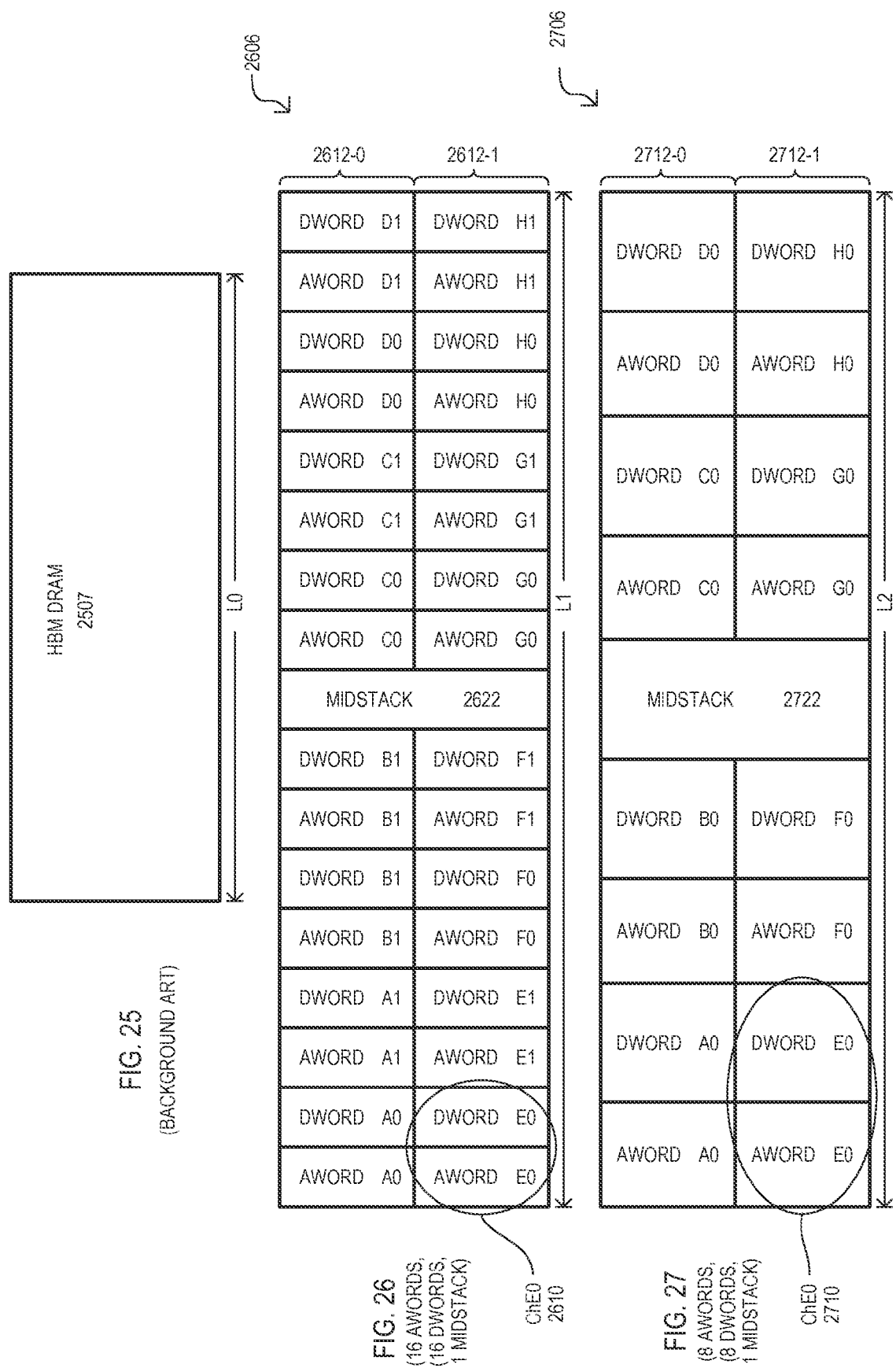

FIG. 28

| 2812-0 | 2812-1 |
|---|---|
| DWORD D1 | DWORD H1 |
| DWORD D0 | DWORD H0 |
| AWORD D1 | AWORD H1 |
| AWORD D0 | AWORD H0 |
| DWORD D1 | DWORD H1 |
| DWORD D0 | DWORD H0 |
| DWORD C1 | DWORD G1 |
| DWORD C0 | DWORD G0 |
| AWORD C1 | AWORD G1 |
| AWORD C0 | AWORD G0 |
| DWORD C1 | DWORD G1 |
| DWORD C0 | DWORD G0 |
| MIDSTACK 2822 | |
| DWORD B1 | DWORD F1 |
| DWORD B0 | DWORD F0 |
| AWORD B1 | AWORD F1 |
| AWORD B0 | AWORD F0 |
| DWORD B1 | DWORD F1 |
| DWORD B0 | DWORD F0 |
| DWORD A1 | DWORD E1 |
| DWORD A0 | DWORD E0 |
| AWORD A1 | AWORD E1 |
| AWORD A0 | AWORD E0 |
| DWORD A1 | DWORD E1 |
| DWORD A0 | DWORD E0 |

2806

(16 AWORDS, 32 DWORDS, 1 MIDSTACK)

ChE0 2810

FIG. 29

| 2912-0 | 2912-1 |
|---|---|
| DWORD D0 | DWORD H0 |
| DWORD D0 | DWORD H0 |
| AWORD D0 | AWORD H0 |
| DWORD D0 | DWORD H0 |
| DWORD D0 | DWORD H0 |
| DWORD C0 | DWORD G0 |
| DWORD C0 | DWORD G0 |
| AWORD C0 | AWORD G0 |
| DWORD C0 | DWORD G0 |
| DWORD C0 | DWORD G0 |
| MIDSTACK 2922 | |
| DWORD B0 | DWORD F0 |
| DWORD B0 | DWORD F0 |
| AWORD B0 | AWORD F0 |
| DWORD B0 | DWORD F0 |
| DWORD B0 | DWORD F0 |
| DWORD A0 | DWORD E0 |
| DWORD A0 | DWORD E0 |
| AWORD A0 | AWORD E0 |
| DWORD A0 | DWORD E0 |
| DWORD A0 | DWORD E0 |

2906

(8 AWORDS, 32 DWORDS, 1 MIDSTACK)

ChE0 2910

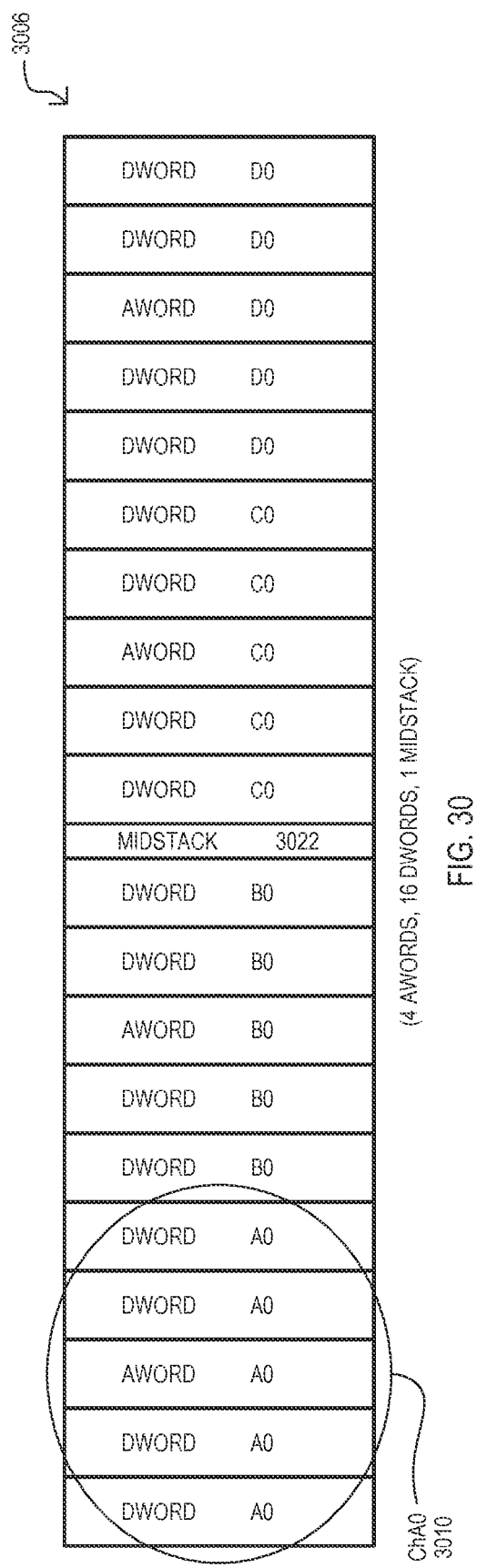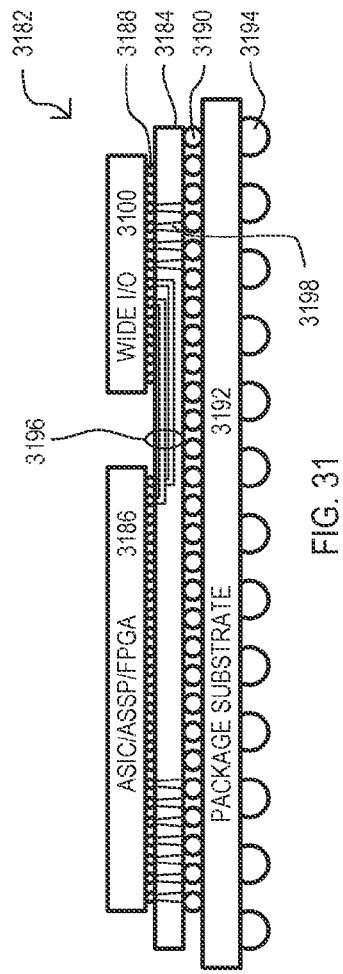
FIG. 30
FIG. 31

MULTI-CHANNEL PHYSICAL INTERFACES AND METHODS FOR STATIC RANDOM ACCESS MEMORY DEVICES

This application claims the benefit of U.S. provisional patent application Ser. No. 61/895,852 filed on Oct. 25, 2013, and Ser. No. 61/912,519 filed on Dec. 5, 2013, and 61/918,885 filed Dec. 20, 2013, the contents all of which are incorporated by reference herein.

TECHNICAL FIELD

The present disclosure relates generally to integrated circuit (IC) memory devices, and more particularly to physical interfaces for static random access memory (SRAM) IC devices.

BACKGROUND

A random transaction rate (RTR) of a memory device can be an important feature for many applications. While the raw Random Transaction Rate (RTR) of the memory device is determined by the address rate of arrays within the memory device, the total transaction rate of a device is determined by the number of banks in the array and the number of addresses and data word transfers supported by the interface.

One type of memory having a fast RTR is a quad data rate (QDR) static random access memory (SRAM). Conventional QDR SRAMs can support two addresses and data word transfers per interface cycle (i.e., two channels) to access two banks in the array ("QDR-IV"). However, for many applications, conventional QDR SRAM do not provide a desired RTR.

One conventional way to increase RTR can be to embed an SRAM memory into an IC that executes the desired application. However, such approaches may not provide adequate storage for an application, may result in reduced yield for the IC, and/or may add to fabrication complexity and/or cost.

BRIEF DESCRIPTION OF THE DRAWINGS

FIG. 9 is a diagram showing a conventional high bandwidth memory dynamic random access memory (HBM DRAM) interface.

FIG. 10 is diagram showing how a physical interface according to embodiments can map to an HBM DRAM interface.

FIGS. 11-20 are diagrams showing SRAM IC device physical interfaces according to various embodiments.

FIG. 22 is a diagram showing detailed connections of a data word that can be included in embodiments.

FIG. 25 is a diagram showing a conventional HBM DRAM interface.

FIGS. 26 to 30 are diagrams showing SRAM IC device physical interfaces for coarse connections, according to various embodiments.

FIG. 31 is a side cross sectional view of an IC device according to an embodiment.

DETAILED DESCRIPTION

Figure 1:
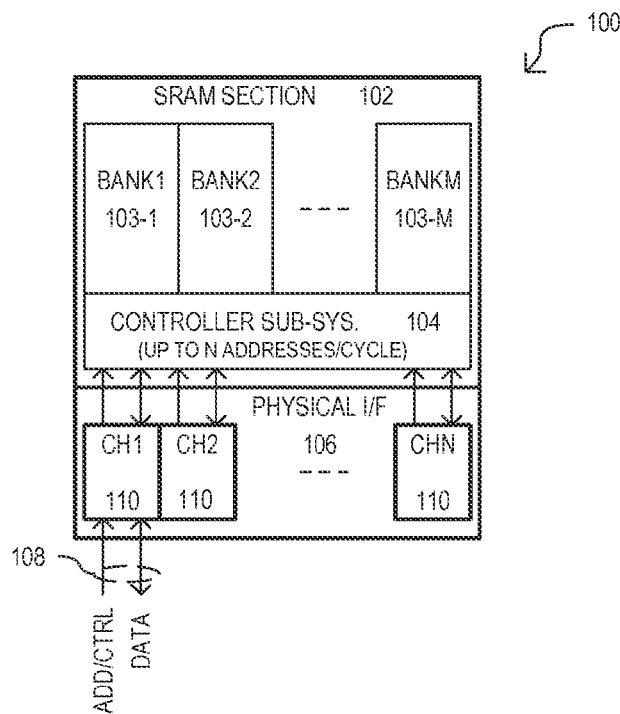
FIG. 1 is a block diagram of a static random access memory (SRAM) integrated circuit (IC) device according to one embodiment.

Various embodiments will now be described that show physical interfaces for static random access memory (SRAM) integrated circuit (IC) devices for very high random transaction rates (RTR). In some embodiments, an SRAM IC device can be capable of receiving addresses on each of multiple channels on consecutive cycles. In addition or alternatively, an SRAM IC device can have a relatively large number of channels, as but one example, more than eight channels.

In the various embodiments described below, like items are referred to the same reference characters but with the leading digit(s) corresponding to the figure number.

FIG. 1 is a block diagram of an SRAM IC device 100 according to an embodiment. An SRAM IC device 100 can include an SRAM section 102, a controller subsystem 104, and a physical interface 106. SRAM section 102 can include a number of SRAM cells for storing data. In the particular embodiment shown, SRAM section 102 can include banks 103-1 to 103-M, that each include a number of memory cells.

Controller subsystem 104 controls paths between physical interface 106 and SRAM storage locations (e.g., banks 103-1 to 103-M). A controller subsystem 104 can provide access to storage locations via a number of memory channels (one shown 108). Each memory channel 108 can provide independent access to storage locations within SRAM section 102. According to some embodiments, a number of memory channels 108 can be relatively large (e.g., more than eight) for a high random transaction rate (RTR). In addition or alternatively, a controller subsystem 104 is capable of processing at a rate of one address on every memory channel 108 on consecutive cycles, which can also deliver a high RTR.

A physical interface 106 can include a number of sections 110 that each include physical connections for one memory channel. Accordingly, each section 110 can include address connections, control connections, and data connections. Connections can be physical structures suitable for receiving and/or transmitting signals. In particular embodiments, connections can include pads, leads, pins, sockets, bumps, balls, etc. As understood from above, because each section 110 includes connections for one memory channel, each section can include a complete address for accessing locations within SRAM section 102.

While FIG. 1 shows bidirectional data paths (DATA) for a channel 108, in alternate embodiments, channels 108 can include unidirectional read data paths separate from corresponding unidirectional write data paths.

In some embodiments, the various sections of SRAM IC device 100 can be formed by a single IC. However, in other embodiments, SRAM IC device 100 can be formed by a number of ICs interconnected with one another.

Figure 2:
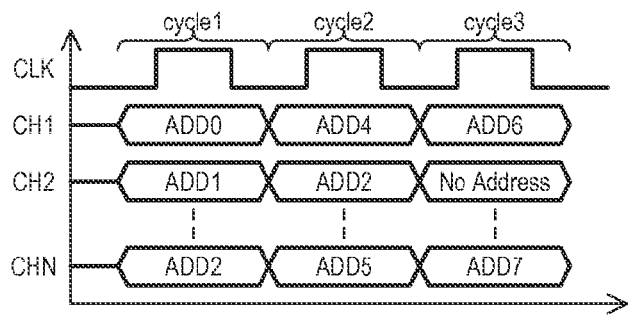
FIG. 2 is a timing diagram showing access operations that occur through a physical interface according embodiments.

FIG. 2 shows access operations of an SRAM IC device according to an embodiment. In a very particular embodiment, FIG. 2 shows operations of the SRAM IC device of FIG. 1. FIG. 2 is a timing diagram showing waveforms for a timing clock (CLK) and address values (ADDx, where x is a number) for a number of memory channels (CH1 to CHN). As shown, each cycle (cycle1, cycle2, cycle3) each channel can receive an address value to access an SRAM storage location. The address values (ADDx) are understood to be complete addresses to enable an access for that channel to start in that cycle.

It is understood that while an SRAM IC device and access method can include receiving address values (ADDx) on every channel for consecutive cycles, this represents a high RTR operation. In operation, some (or all) channels may not receive address values, as shown for channel CH2 in cycle 3. In some embodiments, address values (ADDx) can be received at a double data rate (DDR), with a first portion of the address received during one portion of a clock cycle, and another portion of the address being received on another portion of the same clock cycle. However, in other embodiments, addresses can be a single value received at one portion of the clock cycle (i.e., single data rate, SDR).

Figure 3:
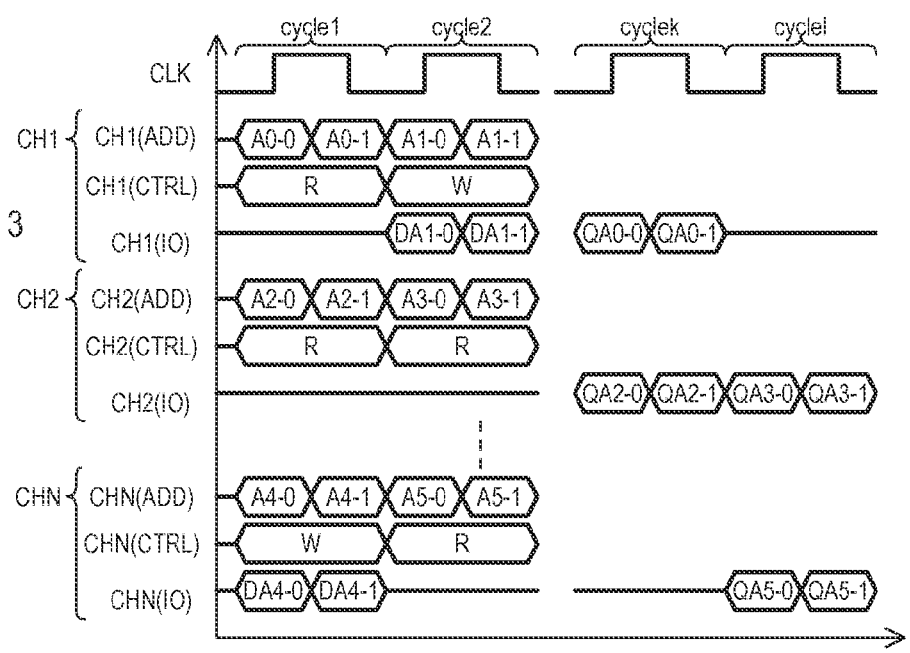
FIG. 3 is a timing diagram showing access operations that occur through a physical interface according a particular embodiment.

FIG. 3 is a timing diagram showing an SRAM IC device access operation according to another embodiment. In a very particular embodiment, FIG. 3 shows operations of the SRAM IC device of FIG. 1. FIG. 3 shows a timing clock (CLK) as well as address values (CHy(ADD)), control values (CHy(CTRL)) and data values (CHy(IO)), for a number of memory channels (where y identifies the channel).

In the embodiment of FIG. 3, address values can be DDR values. For example, the address values A0-0 and A0-1 received for channel CH1 during cycle 1 are two parts of a complete address for accessing a storage location within an SRAM IC device. In contrast, control inputs are single data rate. For example, CH1 shows a read operation (R) initiated for channel CH1 in cycle1 and write operation (W) initiated for channel CH1 in cycle 2. Channel CH2 undergoes two read operations in these two cycles, channel CHN undergoes a write operation followed by a read operation in these two cycles. Read and write data values can be DDR values. For example, the read data values for the read operation to channel CH1 at cycle1 can be output as QA0-0 and QA0-1 during cycle k, while the write data values for the write operation to channel CH1 at cycle2 can be applied as DA1-0 and DA1-1 during cycle2. The remaining accesses via the other channels are understood from the above description.

The accesses shown in FIG. 3 are but provided by way of example. According to embodiments, in a given cycle any number of channels can be active or all channels can be inactive. It is understood that while data values are DDR values in FIG. 3, in alternate embodiments, data values can be SDR values. In addition or alternatively, in alternate embodiments, connections for read data can be separate from connections for write data (i.e., data paths are not bidirectional). Further, while FIG. 3 shows write data values being applied in the same cycle as a write command, in alternate embodiments, all or a portion of the write data values can be applied during a cycle different from that which receives the write command.

Figure 4:
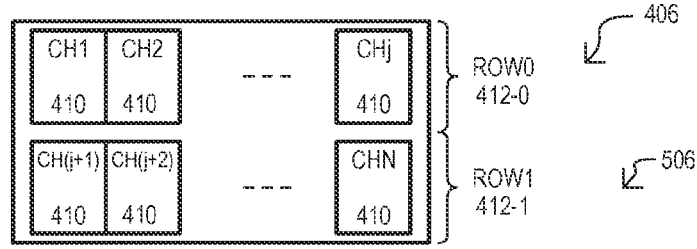
FIG. 4 is diagram showing a physical interface that can be included in embodiments.

FIG. 4 is a plan view showing a physical interface 406 according to an embodiment. Physical interface 406 can include sections 410 for N channels, where each section 410 can include address connections, control connections, and data connections for one channel, as described herein or equivalents. However, the various sections 410 can be arranged into rows (in this embodiment, two rows shown as 412-0/412-1). In some embodiments, sections 410 can each occupy a contiguous area. However, in other embodiments connections can be intermixed. That is, connections for various channels can be distributed at different locations throughout a row (412-0/1).

According to some embodiments, a physical interface can have different configurations. In particular, in one configuration a physical interface can provide addresses for "N" different channels. However, in another configuration, the same physical interface can provide addresses for a greater number (<N) of different channels.

Figures 5A, 5B:
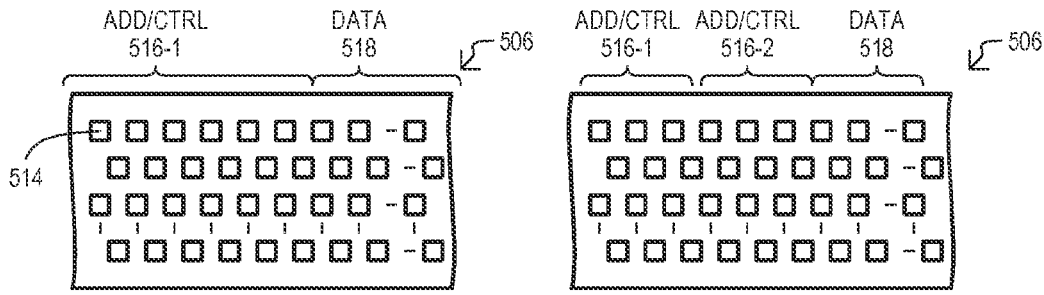
FIGS. 5A and 5B are diagrams showing different configurations of a physical interface according to embodiments.

FIGS. 5A and 5B show a differently configured physical interface 506 according to one embodiment. In FIGS. 5A and 5B, a number of addresses for a physical interface 506 can be increased by "overloading" addresses connections by reducing a data path size (e.g., data bit width), and using the freed connections as address connections. That is, in one configuration, connections can be used as data IOs, but in another configuration, such connections can be used as address inputs, and vice versa.

FIG. 5A shows physical interface 506 in a first configuration. Physical interface 506 can include a number of connections (one shown as 514) arranged into an address section 516-1 and a data section 518. Address section 516-1 can include connections for receiving address and control values for a memory channel. Data section 518 can include connections for receiving and transmitting data of a memory channel. In some embodiments, connections of data section 518 can be bidirectional. However, in other embodiments, connections for data section 518 can be unidirectional, including write data inputs and read data outputs.

FIG. 5B shows physical interface 506 in a second configuration. A portion of data connections can be reconnected as address connections. Consequently, a second address section 516-2 can be created, allowing address and control values for a second memory channel to be applied. It is understood that a same approach can be used to free up connections for data IOs of added channels. In one configuration, a set of data IOs can be for one channel, but in the second configuration, such data IOs can be for two channels. Similarly, in one configuration, a set of data IOs can be for one channel, but in the second configuration, such data IOs can include address connections for a new channel. Further, other types of connections can be repurposed between configurations (i.e., control connections, power supply connections, test connections, configuration connections, etc.).

In this way, in one configuration, a physical interface can have Z connections for N channels. However, in a second configuration the same physical interface can have Z connections for P channels, where P>N, where the data width for each channel is smaller and/or the number of address bits of each channel is smaller.

While a redistribution of connections can be used to vary a number of channels between configurations, according to other embodiments, unused connections can be used to vary channel numbers between configurations.

Figures 6A, 6B:
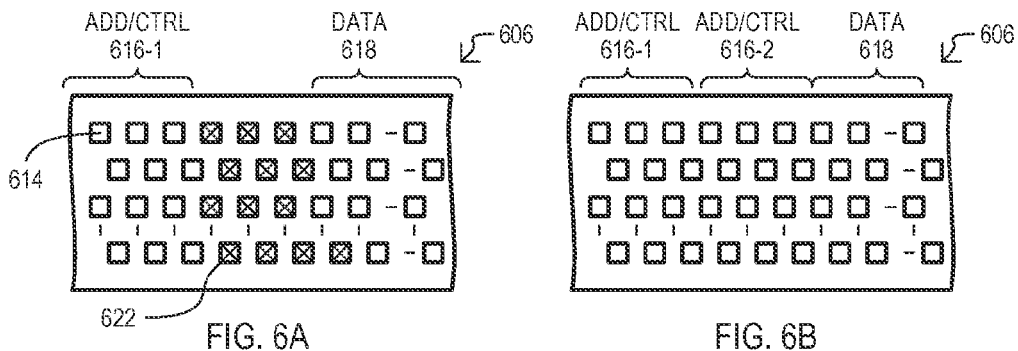
FIGS. 6A and 6B are diagrams showing different configurations of a physical interface according to other embodiments.

FIG. 6A shows physical interface 606 in a first configuration. As in the case of FIG. 5A, physical interface 606 can include a number of connections (one shown as 614) arranged into an address section 616-1 and a data section 618. However, in addition, physical interface 606 can include unused connections (one shown as 622). Unused connections 622 do not serve any function in the first configuration, and thus do not receive any signals or may be tied to a particular potential.

FIG. 6B shows physical interface 606 in a second configuration. In the second configuration, unused connections 622 can be repurposed to serve as address connections. Consequently, a second address section 616-2 can be created. While FIG. 6B shows unused connections connected as address connections for an additional channel, such unused connections can be used as any other type of connection for an additional channel (i.e., data IO connection, power supply connection, etc.).

Figure 7:
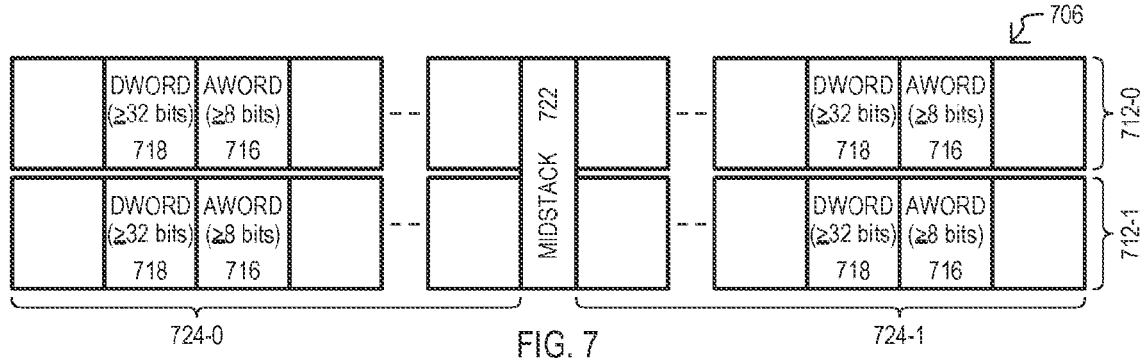
FIG. 7 is diagram showing a physical interface that can be included in embodiments.

FIG. 7 shows a top plan view of a physical interface 706 according to a further embodiment. A physical interface 706 can include a midstack section 722 situated between a first sections 724-0 and second sections 724-1. First and section sections (724-0/1) can each include address sections (716) and data sections (718) for multiple channels. In additions, address/data sections (716/718) can be arranged into two rows (712-0 and 712-1). In a very particular embodiment, address and data sections (716/718) can provide access for more than eight memory channels, including up to 16, 32, 64 or even more memory channels.

A midstack section 722 can include connections for an SRAM IC device apart from those needed for memory channels. According to embodiments, a midstack section can include any of: power supply connections, test connections, reset connections, enable connections, as but a few examples.

While physical interfaces for an SRAM IC devices can accommodate a large number of memory channels, according to embodiments, such an interface can be highly compact, being suitable for "chip" scale packaging, such as multichip modules, or the like.

Figure 8:
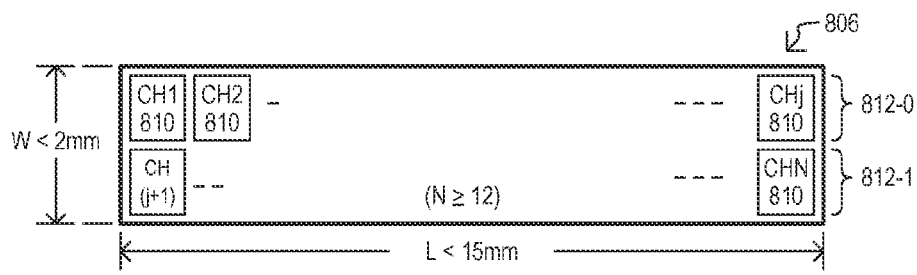
FIG. 8 is diagram showing dimensions of a physical interface that can be included in embodiments.

FIG. 8 shows a physical interface 806 according to an embodiment. A physical interface 806 can include sections 810 that each provide connections for a different memory channel. Sections 810 can each include address (with control) and data sections as describe herein, or equivalents. A number of memory channels can be N, where N≥8.

A physical interface 806 can occupy an elongated area, having a length longer than a width. According to a particular embodiment, a length can be no more than 15 millimeters (mm) and a width can be no more than 2 mm.

FIG. 9 is a diagram showing a high band width memory dynamic RAM (HBM DRAM) interface 907. It is understood that within each rectangular section there can be a number of physical connections for contact with an interposer, or the like. Such sections can be separated by a midstack section 909. Sections DWx-YY are data IO groups, where x identifies a data word, and YY identifies the channel for the data word. Thus, in FIG. 9 DW0-A2, DW1-A2, DW2-A2 and DW3-A2 are data words for channel A2. Sections AW2-YY are address groups, where YY identifies the channel for the address word. Thus, in FIG. 9 AW2-A2 is the one data word for channel A2. Data words (DWx-YY) can have a width of 32 bits (and can include ECC bits, in addition). Address words (AW2-YY) can include address and control inputs for each channel. A MID-STACK section 909 can include additional control inputs or outputs for a DRAM.

FIG. 10 shows an SRAM IC device physical interface 1006 that can be compatible with an HBM DRAM interface, such as that shown in FIG. 9. FIG. 10 shows a SRAM IC device physical interface 1006 having data words (DWORD YY) and address words (AWORD YY), where YY identifies a channel. FIG. 10 also shows the DWORDs and AWORD corresponding to one channel E0 (shown as 1010). The corresponding mappings to the other channels (A0, B0, C0, D0, F0, G0 and H0) are understood from this description. Physical interface 1006 can also include a midstack section 1022 that can include additional inputs/outputs for an SRAM IC device.

FIG. 10 shows a physical interface 1006 with 8 AWORDs and 32 DWORDs arranged into two rows 1012-0 and 1012-1.

Physical interface 1006 can also include unused sections 1020, which can include connections that are not used in the present configuration. Such connection can enable a physical interface 1006 to be configured to accommodate more channels and/or larger address sizes or data widths.

FIG. 10 includes arrows showing how SRAM IC device physical interface 1006 can map to an HBM DRAM.

FIG. 11 shows an SRAM IC device physical interface 1106 according to another embodiment. Physical interface 1106 includes data words (DWORD YY) and address words (AWORD YY) as in the case of FIG. 10. However, there are a greater number of them in each row. Further, physical interface 1106 can include multiple midstacks instead of one (in the embodiment shown, two midstacks 1122-0 and 1122-1).

FIG. 11 shows a physical interface 1106 with 16 AWORDs and 64 DWORDs arranged into two rows 1112-0 and 1112-1. DWORDs and AWORD for one channel EU are shown as 1110.

Thus, a greater number of channels can be provided, as compared to FIG. 10, by including greater numbers of connections (i.e., "overloading" the interface with more address and/or data word connections).

FIG. 12 shows an SRAM IC device physical interface 1206 according to another embodiment. Physical interface 1206 includes data words (DWORD YY) and address words (AWORD YY) as in the case of FIG. 10. FIG. 12 shows a physical interface 1206 like that of FIG. 11, including 16 AWORDs and 64 DWORDs arranged into two rows 1212-0 and 1212-1. However, unlike FIG. 11, there is one midstack 1222, not two. DWORDs and the AWORD for one channel E0 are shown as 1210.

FIG. 13 shows an SRAM IC device physical interface 1306 according to another embodiment. Physical interface 1306 includes data words (DWORD YY) and address words (AWORD YY) as in the case of FIG. 10. FIG. 13 shows a physical interface 1306 that includes 32 AWORDs, 32 DWORDs arranged into two rows 1312-0 and 1312-1, and one midstack 1322. A DWORD and AWORD for one channel E0 are shown as 1310. That is, in the embodiment of FIG. 13 there can be one AWORD and one DWORD for each channel.

Such an arrangement can allow for a high RTR, by enabling up to 32 SRAM memory channels to be accessed every cycle.

In particular embodiments, FIG. 13 can be one configuration for an interface like that of FIG. 10 that utilizes unused sections to increase the number of channels, while at the same time reducing a channel data width size.

FIG. 14 shows an SRAM IC device physical interface 1406 according to another embodiment. Physical interface 1406 shows an arrangement like that of FIG. 13 (i.e., 32 AWORDs, 32 DWORDs, and one midstack 1422). However, the arrangement of AWORDs and DWORDs differs, as shown by the DWORD and AWORD for one channel E0 1410 (i.e., two AWORDS alternate with two DWORDS).

FIG. 15 shows an SRAM IC device physical interface 1506 according to another embodiment. Physical interface 1506 shows an arrangement like that of FIG. 13 (i.e., 32 AWORDs, 32 DWORDs, and one midstack 1522). However, the arrangement of AWORDs and DWORDs differs, as shown by the DWORD and AWORD for one channel E0 1510 (i.e., an AWORD and DWORD for a same channel are adjacent to one another).

FIG. 16 shows an SRAM IC device physical interface 1606 according to another embodiment. Physical interface 1606 shows an arrangement like that of FIG. 13 (i.e., 32 AWORDs, 32 DWORDs, and one midstack 1622). However, the arrangement of AWORDs and DWORDs differs, as shown by the DWORD and AWORD for one channel E0 1610 (i.e., each quadrant includes six AWORDs followed by four DWORDs, followed by two AWORDs, followed by four DWORDs).

FIG. 17 shows an SRAM IC device physical interface 1706 according to another embodiment. Physical interface 1706 shows an arrangement like that of FIG. 13 (i.e., 32 AWORDs, 32 DWORDs, and one midstack 1722). However, the arrangement of AWORDs and DWORDs differs, as shown by the DWORD and AWORD for one channel E0 1710 (i.e., two DWORDs alternate with two AWORDs).

FIGS. 12-17 are understood to be illustrative of possible AWORD/DWORD patterns, and should not be construed as limiting. Alternate embodiments can include any suitable AWORD/DWORD pattern.

As understood from embodiments herein, an interface compatible for one number of channels can be compatible for operation with a smaller number of channels by not using groups of connections.

FIG. 18 shows an SRAM IC device physical interface 1806 that includes data words (DWORD YY) and address words (AWORD YY) as in the case of FIG. 17, however, there are smaller number of AWORDS. As shown, physical interface 1806 can include 16 AWORDs and 32 DWORDs arranged into two rows 1812-0 and 1812-1, as well as one midstack 1822. DWORDs and AWORD for one channel E0 are shown as 1810.

As also understood from embodiments herein, an interface compatible for one number of channels, that includes unused connections, can be compatible for operation with a greater number of channels by repurposing unused connections for additional channels. Thus, in particular embodiments, FIG. 18 can be one configuration for an interface like that of FIG. 10 that utilizes unused sections to increase the number of channels, while at the same time reducing a channel data width size.

FIG. 19 shows an SRAM IC device physical interface 1906 according to another embodiment. Physical interface 1906 shows an arrangement like that of FIG. 18 (i.e., 16 AWORDs, 32 DWORDs, and one midstack 1922). However, the arrangement of AWORDs and DWORDs differs, as shown by the DWORDs and AWORD for one channel E0 1910.

FIG. 20 shows an SRAM IC device physical interface 2006 according to another embodiment. Physical interface 2006 shows an arrangement like that of FIG. 10 (i.e., 8 AWORDs, 32 DWORDs, and one midstack 2022). However, the arrangement of AWORDs and DWORDs differs, as shown by the DWORDs and AWORD for one channel E0 2010.

As noted herein, data sections (e.g., DWORDs) and address sections (e.g., AWORDs) can include a number of physical connections. One very particular physical connection arrangement is shown in FIG. 21.

Figure 21:
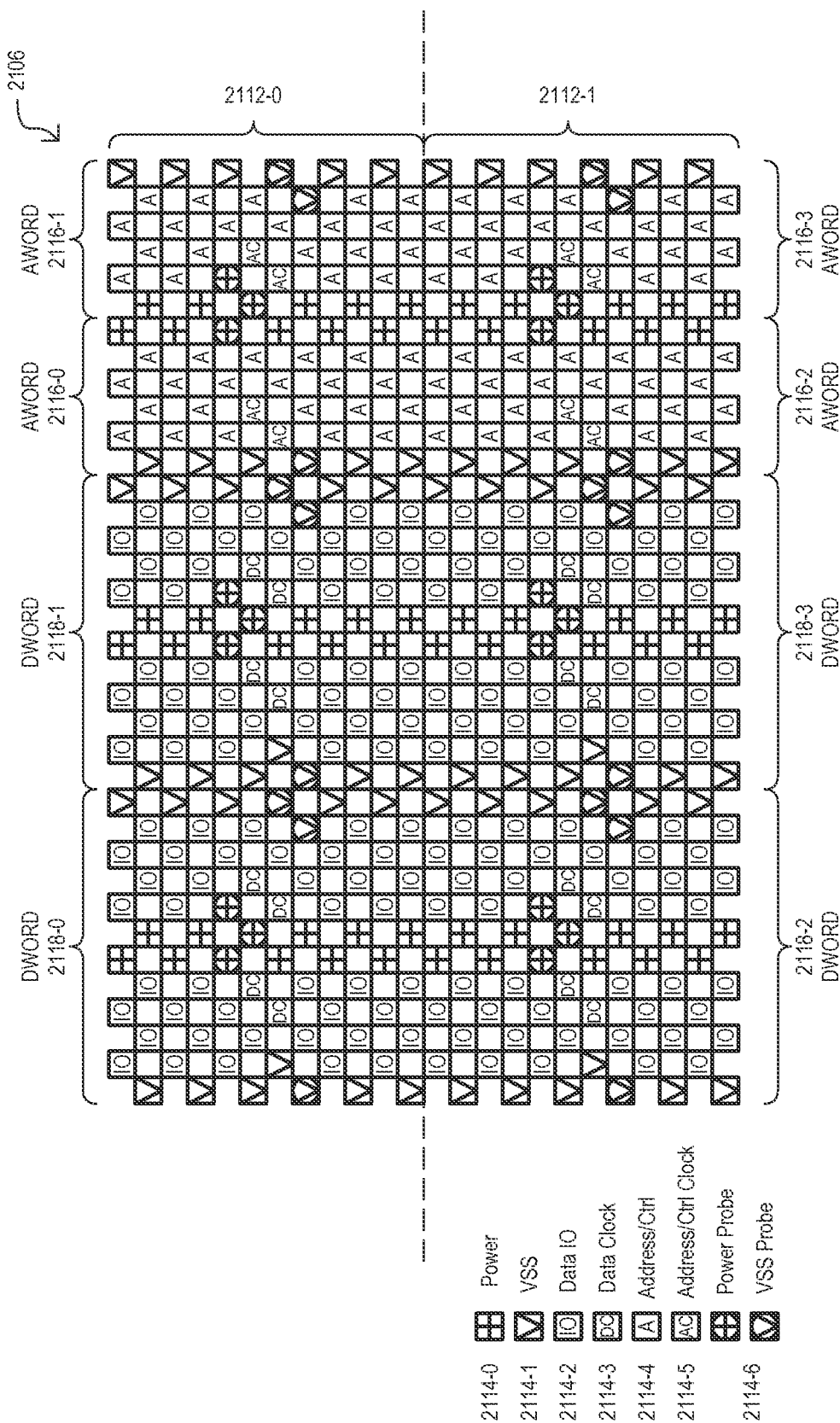
FIG. 21 is a diagram showing connection arrangements of a physical interface according to embodiments.

FIG. 21 is a plan view of a portion of a physical interface 2106 showing connections for four DWORDs (2118-0 to 2118-3) and four AWORDs (2116-0 to 2116-3). Two DWORDs and two AWORDs form portions of two rows 2112-0 and 2112-1.

FIG. 21 includes a legend identifying a type of connection included in each DWORD (2118-0 to 2118-3) and AWORD (2116-0 to 2116-3). Connections can include power connections 2114-0 (which can provide a high power supply to an SRAM IC device), VSS connections 2114-1 (which can provide a low power supply to an SRAM IC device), data IO connections 2114-2 (which can provide bidirectional data paths for read data and write data, or a unidirectional data path for read data or write data), data clock connections 2114-3 (which can provide a timing clock for the latching of write data and/or the output of read data), address control connections 2114-4 (which can provide address values identifying a storage locations or control values indicating a type of access), address/control clock connections 2114-5 (which can provide a timing clock for the latching of address values and/or control values), and probe connections 2114-6 (which can provide locations to probe an SRAM IC device for testing or other purposes).

As shown, within each DWORD (2118-0 to 2118-3) data IO connections can be bounded on both sides by power supply connections. Similarly, within each AWORD (2116-0 to 2116-3) address and control connections can be bounded by power supply connections.

Figure 22:
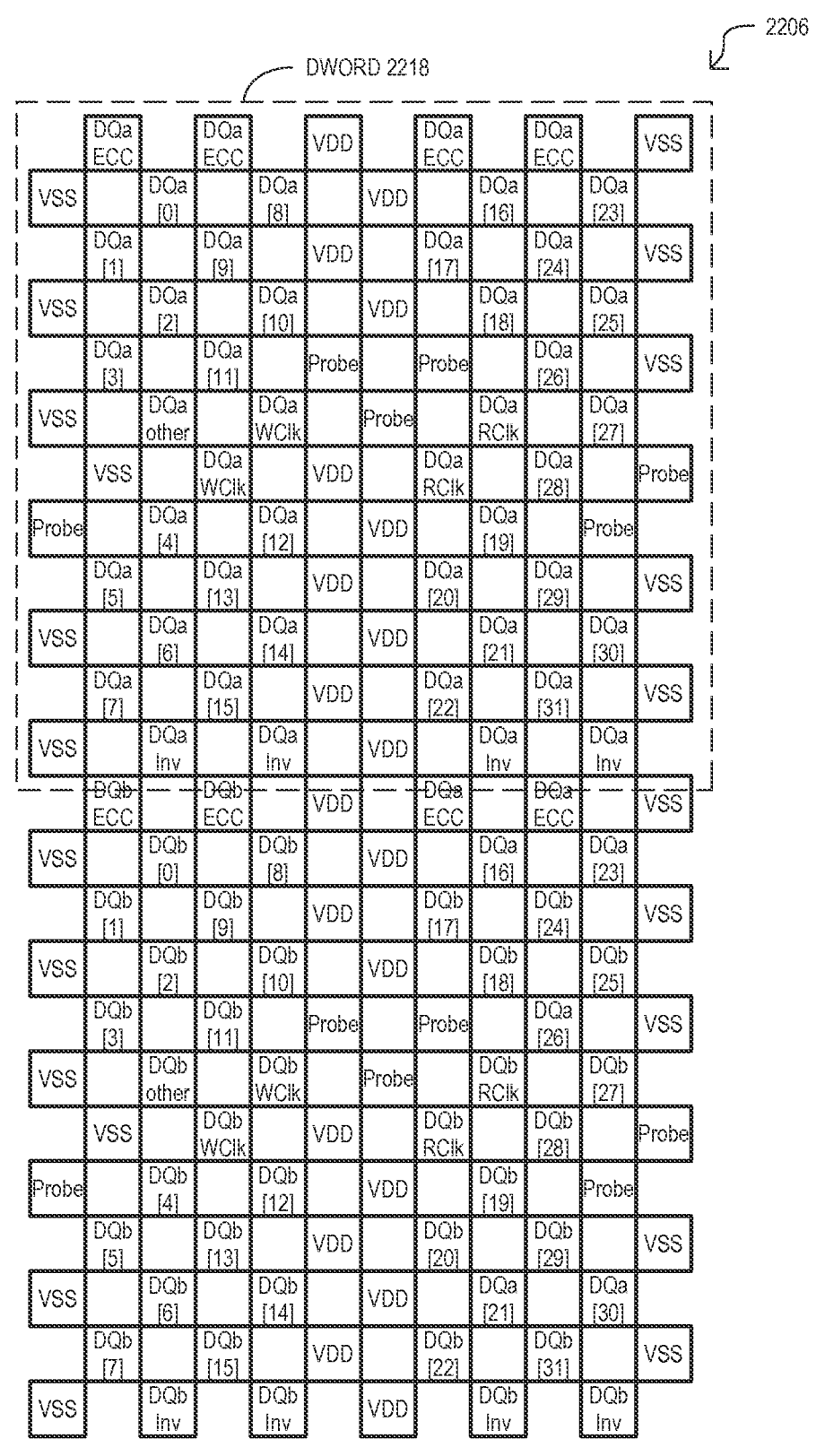

FIG. 22 is a plan view of a portion of a physical interface 2206 showing detailed connections for two DWORDs (own shown as 2218) that can be included in embodiments. As shown, a DWORD 2218 can include connections for error detection and correction bits (DQa ECC), high power supply connections (VDD), low power supply connections (VSS), data bit connections (DQa[0] to DQ[31]), probe connections (Probe), a write data clock connection (DQa WClk), a read data clock connection (DQa RClk), data inversion control bit connections (DQa Inv), as well as connections that may be unused or used for the purposes (DQ other).

Accordingly, a data section according to embodiments can include, in addition to data IOs, various clocks for timing read/write data, error correction/detection bits, power supply connections, and data inversion control bits for inverting data values prior to being read and/or written from storage locations of the SRAM IC device.

Figure 23:
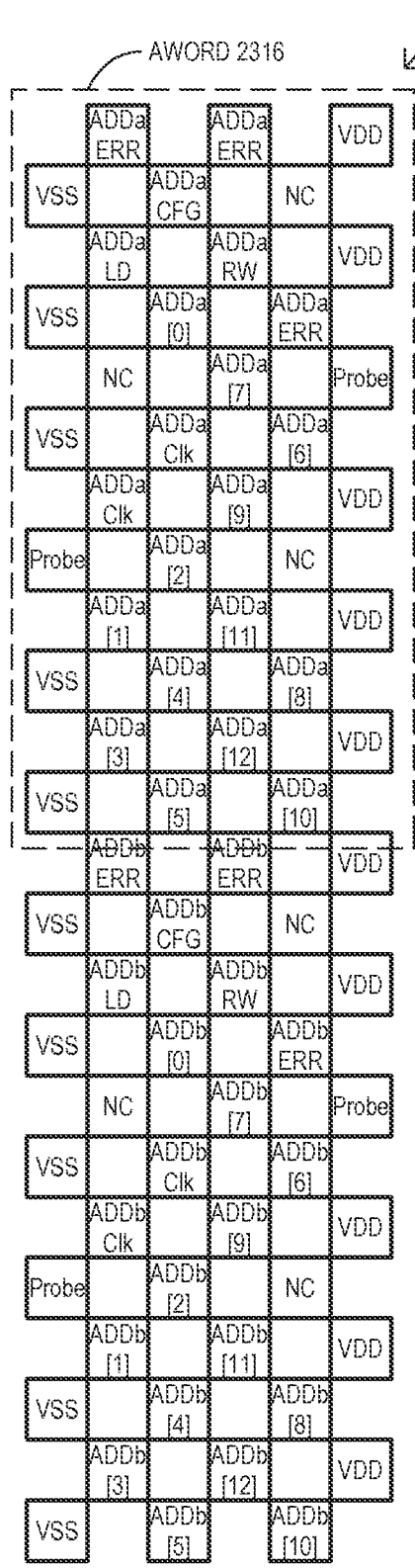
FIG. 23 is a diagram showing detailed connections of an address word that can be included in embodiments.

FIG. 23 is a plan view of a portion of a physical interface 2306 showing detailed connections for two AWORDs (own shown as 2316) that can be included in embodiments. As shown, an AWORD 2316 can include connections for error detection and correction bits (ADDa ECC), high power supply connections (VDD), low power supply connections (VSS), load command input connection (ADDa LD), read/write control input connection (ADDa RW), address bits (ADDa[0] to ADDa[12]), probe connections (Probe), and an address/control clock connection (ADDa Clk). Unused connections are shown as NC.

Accordingly, an address section according to embodiments can include, in addition to address and control inputs, clocks for timing address and control values, error correction/detection bits, and power supply connections.

Figure 24:
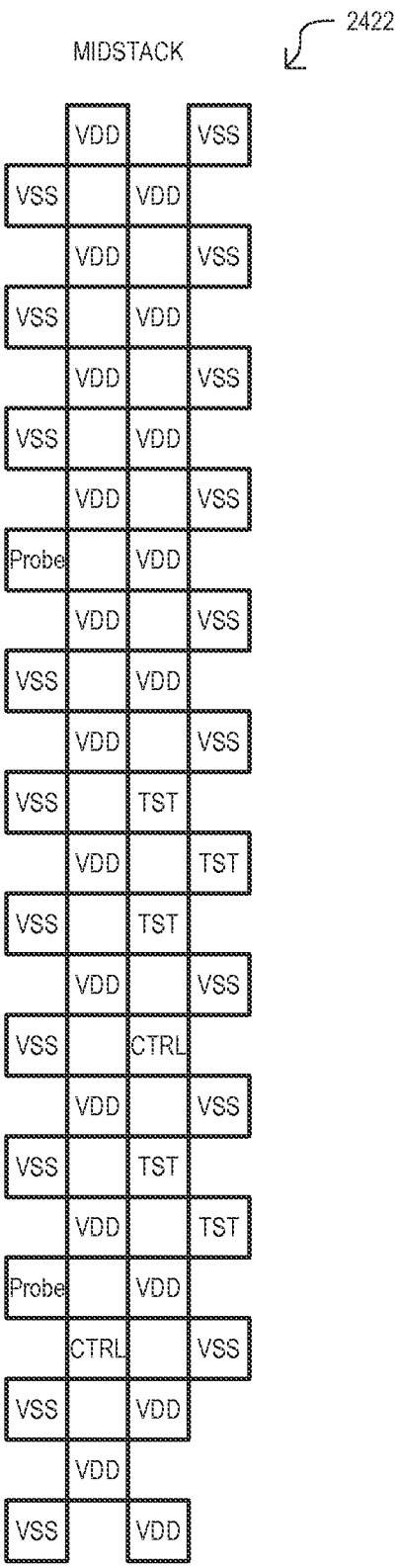
FIG. 24 is a diagram showing detailed connections of a midstack that can be included in embodiments.

FIG. 24 is a plan view showing detailed connections of a midstack 2422 that can be included in embodiments. As shown, a midstack 2422 can include connections for high power supply connections (VDD), low power supply connections (VSS), test connections (TST) for testing an SRAM IC device, and control connections (CTRL) (e.g., setting or resetting an SRAM IC device).

While embodiments can include physical interfaces with connection spacing compatible with existing standards, the various interface configurations shown herein can be utilized with a coarser spacing (e.g., greater spacing between connections).

FIG. 25 is a representation of an HBM DRAM interface 2507, such as that shown in FIG. 9. HBM DRAM interface 2507 can have a length (L0) determined by a fine pitch of its physical connections.

FIG. 26 shows an SRAM IC device physical interface 2606 according to another embodiment. FIG. 26 shows data words (DWORD YY) and address words (AWORD YY), including 16 AWORDs and 16 DWORDs arranged into two rows 2612-0 and 2612-1, as well as one midstack 2622. A DWORD and AWORD for one channel E0 are shown as 2610.

Physical interface 2606 can have a length (L1) greater than that of the HBM DRAM interface 2507. It is understood that connections within the AWORDs and DWORDs of physical interface 2606 can be coarser than those of the HBM DRAM interface 2507. As but one example, connections of physical interface 2606 can have a greater pitch between connections and/or such connections can be larger than show of HBM DRAM interface 2507.

FIG. 27 shows an SRAM IC device physical interface 2706 according to another embodiment. FIG. 27 shows data words (DWORD YY) and address words (AWORD YY), including 8 DWORDs and 8 AWORDs arranged into two rows 2712-0 and 2712-1, as well as one midstack 2722. A DWORD and AWORD for one channel E0 are shown as 2710.

Physical interface 2706 can have a length (L2) greater than that of the HBM DRAM interface 2507. It is understood that connections within the AWORDs and DWORDs of physical interface 2706 can be coarser than those of the HBM DRAM interface 2507 and those of FIG. 26.

FIG. 28 shows an SRAM IC device physical interface 2806 according to a further embodiment. FIG. 28 shows a physical interface like that of FIG. 18, including 16 AWORDs and 32 DWORDs arranged into two rows 2812-0 and 2812-1, as well as one midstack 2822. DWORDs and an AWORD for one channel E0 are shown as 2810.

In one embodiment, a physical interface 2806 can include coarser connections than those shown in FIG. 18. By not including unused sections (e.g., 1820 in FIG. 18), physical interface 2806 can include the same number of channels and data width size as FIG. 18, with coarser connections, but without a substantially larger footprint.

FIG. 29 shows an SRAM IC device physical interface 2906 according to another embodiment. FIG. 29 shows 8 AWORDs and 32 DWORDs arranged into two rows 2912-0 and 2912-1, as well as one midstack 2922. DWORDs and an AWORD for one channel E0 are shown as 2910.

In one embodiment, a physical interface 2906 can include coarser connections than those shown in FIG. 28 and those of FIG. 25 (i.e., an HBM DRAM interface). While a number of connections can be limited by the larger pitch of connections, a multichannel SRAM IC device interface can still be provided.

FIG. 30 shows an SRAM IC device physical interface 3006 according to yet another embodiment. Physical interface 3006 can include 4 AWORDs, 16 DWORDs and a midstack 3022 arranged into a single row. It is understood that additional AWORDs and/or DWORDs can be added on either end of the single row for a greater number of channels, greater address space and/or greater data width per channel.

In one embodiment, a physical interface 2906 can include coarser connections than those shown in FIG. 29 and those of FIG. 25 (i.e., an HBM DRAM interface).

FIG. 31 is a side cross sectional view of an IC device 3182 according to an embodiment. An IC device 3182 can be a multichip module that includes an SRAM IC 3100, one or more other ICs 3186, an interposer 3184, and a package substrate 3192. In particular embodiments, IC device 3182 can have a "2.5 D package" configuration.

A SRAM IC 3100 can include storage locations accessible by multiple memory channels on consecutive cycles. Further, SRAM IC 3100 can include a physical interface as described herein, or an equivalent. SRAM IC 3100 can have physical and electrical contact with interposer 3184, via first connections 3188, which can be connections of a physical interface as described herein. SRAM IC 3100 can have electrical connections to other IC 3186 via routing layers 3196 within interposer 3184. Other IC 3186 can also have physical and electrical contact with interposer 3184 via first connections 3188.

Interposer 3184 can provide electrical connections between ICs (e.g., 3100, 3186) via first connections on a first surface. Interposer 3184 can include second connections 3190 on a second surface, opposite to the first surface. In the embodiment shown, interposer 3184 can include vias 3198 connecting second connections 3190 to first connections 3188. In one embodiment, such vias 3198 can include power supply connections for the ICs (e.g., 3100, 3186).

Package substrate 3192 can provide electrical paths between second connections 3190 and package connections 3194.

SRAM IC 3100 can be a "known good die" (KGD) type package. The other IC 3186 can be an application specific IC (ASIC), application specific standard product (ASSP), or programmable logic device, such as a field programmable gate array (FPGA). Interposer 3184 can be a silicon interposer, and vias 3198 can be through silicon vias (TSVs). First connections 3188 can be micro bump connections having a pitch of about 55 um and a size of about 25 um. Second connections can be C4 bumps having a pitch of about 200 um and solder ball size of about 310 um. Package connections 3194 can be solder balls having a pitch of about 200 um and a size of about 1 mm.

In particular embodiments, IC 3186 can utilize SRAM IC 3100 for packet processing functions, including but not limited to network analytics and/or packet buffering. In particular, IC device 3182 can perform packet lookup functions, packet statistic/state storage an update, as well as packet scheduling. In addition or alternatively, an IC device 3182 can be a MAC framer and provide head-to-tail caching.

Figure 32:
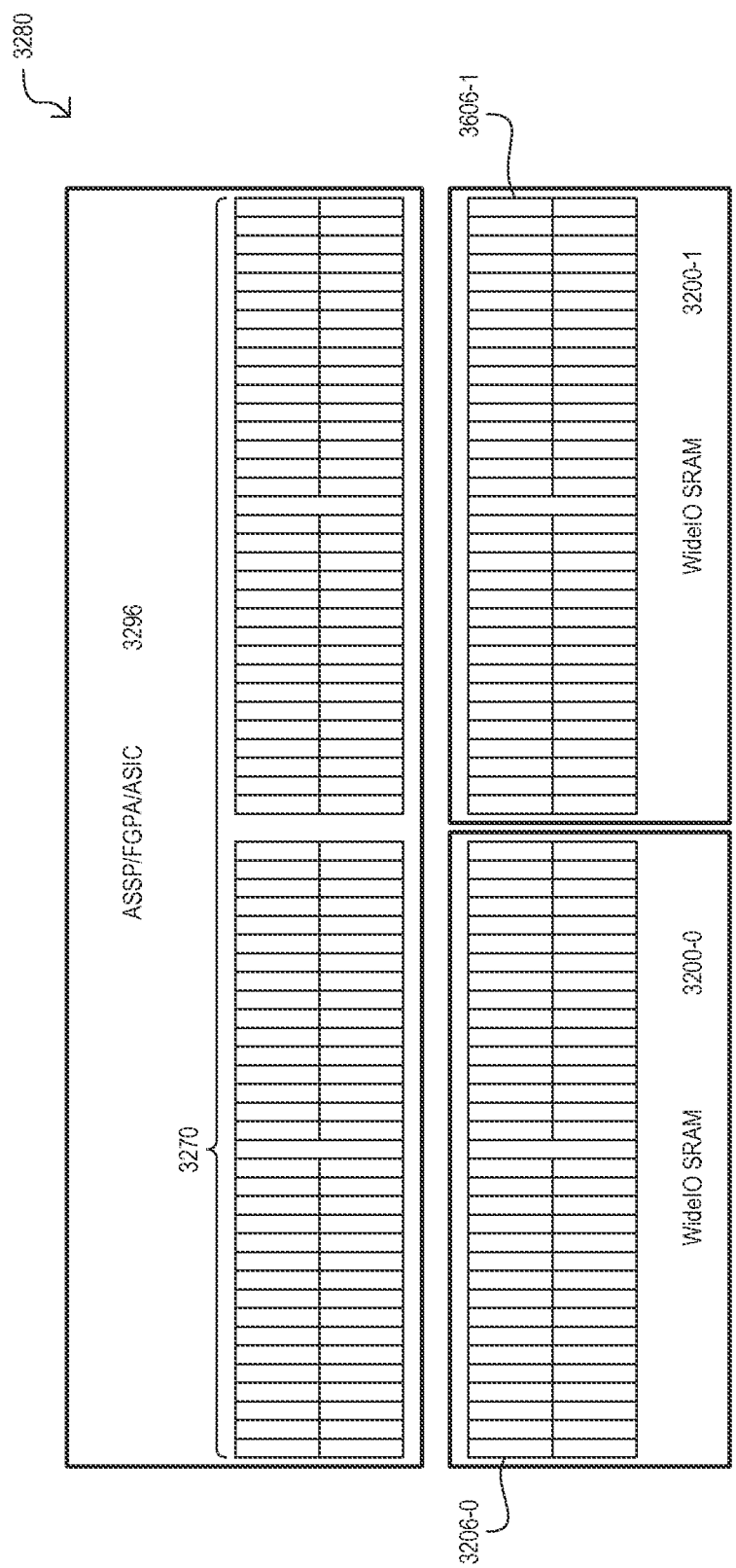
FIG. 32 is a diagram showing interface connections between a system IC and two SRAM IC devices, according to an embodiment.

FIG. 32 shows a connection arrangement between system IC device 3296 and two SRAM IC devices 3200-0 and 3200-1 according to embodiments. SRAM IC devices 3200-0/1 can each include a physical interface 3206-0/1 as described herein, or equivalents.

System IC device 3296 can include a wide IO interface 3270 that can have connections that can be connected to those of the SRAM IC devices 3200-0/1. Thus, electrical connections can be made between wide IO interface 3270 and the physical interfaces 3206-0/1 of the SRAM IC devices. Such electrical connections can be direct, or via some intermediary structure (e.g., interposer, circuit board, etc.). In the former case, IO interface 3270 can have a layout that is complementary to the SRAM physical interfaces 3206-0/1.

It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A device, comprising:
   a static random access memory (SRAM) section comprising a plurality of memory banks; and
   an interface comprising physical connections for more than eight channels, the connections for each memory channel including:
     an address section including connections for SRAM control inputs and a complete address to access the memory banks, and
     a data section including data inputs and outputs (data IOs) to transfer data for one memory bank;
   wherein:
     the device is an integrated circuit (IC) device;
     in a first configuration the interface includes address sections for N channels and a plurality of unused connections; and
     in a second configuration the interface includes address sections for P channels, where P is greater than N, the unused connections of the first configuration serving as address connections in the second configuration.

2. The device of claim 1, wherein:
   the SRAM section operates in synchronism with a clock, and is configured to receive one complete address on any memory channel on each cycle of the clock.

3. The device of claim 1, wherein:
   the interface includes two rows of connections, each row including connections for a plurality of memory channels.

4. The device of claim 1, wherein:
   each address section includes connections for no less than eight address bits.

5. The device of claim 1, wherein:
   each data section includes connections for no less than 32 data IO bits.

6. The device of claim 1, wherein:
   each data section further includes connections for at least one write data clock for timing a latching of write data received on the data IOs.

7. The device of claim 1, wherein:
   each data section further includes connections for a read data clock for timing an output of read data on the data IOs.

8. A device, comprising:
   a static random access memory (SRAM) section comprising a plurality of memory banks; and
   an interface comprising physical connections for more than eight channels, the connections for each memory channel including:
     an address section including connections for SRAM control inputs and a complete address to access the memory banks, and
     a data section including data inputs and outputs (data IOs) to transfer data for one memory bank;
   wherein:
     the device is an integrated circuit (IC) device; and
     the interface further comprises a midstack section comprising one or more midstack connections, the midstack connections including any selected from the group of: control inputs to the IC device and test connections for the IC device.

9. A device, comprising:
   a static random access memory (SRAM) section configured to operate in synchronism with a clock, and receive one complete address on each of a plurality of memory channels on any cycle of the clock; and
   a physical interface comprising, for each channel,
     an address section including connections for SRAM control inputs and a complete address to access any of a plurality of memory banks, and
     a data section including data inputs and outputs (data IOs) to transfer data for one memory bank;
   wherein:
     the device is an integrated circuit (IC) device;
     in a first configuration the physical interface includes address sections for N channels and a plurality of unused connections; and
     in a second configuration the physical interface includes address sections for P channels, where P is greater than N, the unused connections of the first configuration serving as address connections in the second configuration.

10. The device of claim 9, wherein:
    the SRAM section is configured to latch address data received on the address sections at a double data rate, in synchronism with rising and falling edges of the clock.

11. The device of claim 9, wherein:
    the SRAM section is configured to latch control data received on the address sections at a single data rate, once every clock cycle.

12. The device of claim 9, wherein:
    the SRAM section is configured to latch data transferred over the data sections at a double data rate, in synchronism with rising and falling edges of the clock.

13. The device of claim 9, wherein:
    the physical interface includes no less than 16 address sections and 16 data sections.

14. A method, comprising:
    accessing memory cell banks of a static random access memory (SRAM) section in an integrated circuit (IC) device via a plurality of memory channels, where each memory channel access occurs through a physical interface, in the IC device, that includes
      an address section including connections for SRAM control inputs and a complete address to access the memory banks, and
      a data section including data inputs and outputs (data IOs) to transfer data for one memory bank;
    wherein:
      the SRAM section is configured to operate in synchronism with a clock, and receive one complete address on each of a plurality of memory channels on each cycle of the clock;
      in a first configuration the physical interface includes address sections for N channels and a plurality of unused connections; and in a second configuration the physical interface includes address sections for P channels, where P is greater than N, the unused connections of the first configuration serving as address connections in the second configuration.

15. The method of claim 14, wherein:
the memory channels number no less than twelve.

16. The method of claim 15, wherein:
accessing memory cells of the SRAM section includes latching address data received on the address sections at a double data rate, in synchronism with rising and falling edges of the clock.

17. The method of claim 14, wherein:
accessing memory cells of the SRAM section includes latching control data received on the address sections at a single data rate, once every clock cycle.

18. The method of claim 14, wherein:
accessing memory cells of the SRAM section includes transferring data over the data sections at a double data rate, in synchronism with rising and falling edges of the clock.

19. The method of claim 14, further including:
applying high and low power supply voltages to via a plurality of connections in the address sections and data sections.

* * * * *